(12) United States Patent
Narumi

(10) Patent No.: US 9,655,248 B2
(45) Date of Patent: May 16, 2017

(54) METHOD OF MANUFACTURING A WIRING BOARD

(71) Applicant: KYOCERA SLC Technologies Corporation, Yasu-shi, Shiga (JP)

(72) Inventor: Daisuke Narumi, Otsu (JP)

(73) Assignee: Kyocera Corporation, Kyoto (JP)

( * ) Notice: Subject to any disclaimer, the term of this patent is extended or adjusted under 35 U.S.C. 154(b) by 392 days.

(21) Appl. No.: 14/468,707

(22) Filed: Aug. 26, 2014

(65) Prior Publication Data
US 2015/0059170 A1    Mar. 5, 2015

(30) Foreign Application Priority Data

Aug. 31, 2013    (JP) ................................. 2013-180767

(51) Int. Cl.
| | |
|---|---|
| *H05K 3/30* | (2006.01) |
| *H05K 1/18* | (2006.01) |
| *H05K 3/02* | (2006.01) |
| *H05K 3/28* | (2006.01) |
| *H05K 3/46* | (2006.01) |

(52) U.S. Cl.
CPC .... *H05K 1/185* (2013.01); *H01L 2224/16225* (2013.01); *H05K 3/025* (2013.01); *H05K 3/284* (2013.01); *H05K 3/4652* (2013.01); *H05K 3/4697* (2013.01); *H05K 2203/1322* (2013.01); *Y10T 29/4913* (2015.01)

(58) Field of Classification Search
CPC .......... H05K 3/30; H05K 3/025; H05K 3/284; H05K 3/4697; H05K 3/4652; H05K 1/185; H05K 2203/1322; Y10T 29/4913; Y10T 29/49124; Y10T 29/49117; Y10T 29/49002
USPC ........................ 29/832, 829, 825, 592.1, 846
See application file for complete search history.

(56) References Cited

U.S. PATENT DOCUMENTS

| | | | |
|---|---|---|---|
| 2006/0291173 A1 | 12/2006 | Cho et al. | |
| 2007/0269590 A1* | 11/2007 | Miyamoto | .......... H01L 21/4832 427/125 |
| 2009/0301766 A1* | 12/2009 | Park | .................... H01L 23/3121 174/255 |

FOREIGN PATENT DOCUMENTS

JP    2007-5768 A    1/2007

* cited by examiner

*Primary Examiner* — Peter DungBa Vo
*Assistant Examiner* — Azm Parvez
(74) *Attorney, Agent, or Firm* — Volpe and Koenig, P.C.

(57) ABSTRACT

There is provided a method of manufacturing a wiring board, including the steps of: preparing an insulating layer 1*a* including a cavity formation region X, and a separable metallic foil M formed of first and second metallic foils M1 and M2; allowing the separable metallic foil M to adhere to at least a lower face side of the insulating layer 1*a* with the first metallic foil M1 serving as an adhering surface; forming a cavity 2 by digging the insulating layer 1*a* and the separable metallic foil M in a cavity formation region X from an upper surface side of the insulating layer 1*a* to a depth that does not penetrate the second metallic foil M2; inserting an electronic component D into the cavity 2, and fixing the electronic component D by a fixing resin J; and peeling off the second metallic foil M2.

5 Claims, 6 Drawing Sheets

METHOD OF MANUFACTURING A WIRING BOARD

BACKGROUND OF THE INVENTION (1) Field of the Invention

The present invention relates to a method of manufacturing an electronic component built-in wiring board incorporating therein an electronic component which is accommodated in a cavity provided in an insulating layer.

(2) Description of the Related Art

In recent years, an electronic component has been highly densified and functionalized in response to a demand for high performance and miniaturization of an electronic device. As a result, a wiring board capable of high-density packaging of an electronic component is demanded. As such a wiring board, an electronic component built-in wiring board has been developed (Japanese Patent Application Laid-Open No. 2007-005768).

First, with reference to FIG. 4, a description will be given of one example of an electronic component built-in wiring board B which is manufactured according to a conventional method of manufacturing. The wiring board B includes an insulating board 21, a wiring conductor 24, a solder resist layer 26 formed on the insulating board 21 and the wiring conductor 24, and an electronic component D accommodated in the insulating board 21.

The insulating board 21 includes a first insulating layer 21a, and second insulating layers 21b, 21b laminated on upper and lower surfaces of the first insulating layer 21a. A cavity 22 for accommodating therein the electronic component D is formed in the first insulating layer 21a. In the cavity 22, the electronic component D is accommodated while the electronic component D is fixed by parts of the second insulating layers 21b, 21b.

Further, a through-hole 23 is formed in the first insulating layer 21a. The wiring conductor 24 adheres to the upper and lower surfaces of the first insulating layer 21a and inside the through-hole 23. With this arrangement, the wiring conductors 24, 24 on the upper and lower surfaces of the first insulating layer 21a are electrically connected to each other via the through hole 23.

A plurality of via holes 25 are formed in the second insulating layer 21b. The wiring conductor 24 also adheres to a surface of the second insulating layer 21b and inside the via holes 25. A part of the wiring conductor 24 on the surface of the second insulating layer 21b is electrically connected to the wiring conductors 24, 24 on the upper and lower surfaces of the first insulating layer 21a via the via holes 25. Further, a different part of the wiring conductor 24 on the surface of the second insulating layer 21b is electrically connected to an electrode T of the electronic component D through the via holes 25.

The electronic component D includes, for example, a chip capacitor for stabilizing power supply to a semiconductor element S, and the like.

Further, a part of the wiring conductor 24 formed on the upper surface of the second insulating layer 21b on an upper surface side is exposed in an opening 26a formed in the solder resist layer 26, and forms a semiconductor element connecting pad 27. Then, by connecting an electrode of the semiconductor element S to the semiconductor element connecting pad 27 via a solder bump, the semiconductor element S is mounted on an upper surface of the wiring board B.

Further, part of the wiring conductor 24 formed on the lower surface of the second insulating layer 21b on a lower surface side is exposed in an opening 26b formed in the solder resist layer 26, and forms an external connection pad 28 for connection to an external electric circuit board. Then, by connecting the external connection pad 28 and an electrode of the external electric circuit board to each other, the semiconductor element S is electrically connected to the external electric circuit board, and the semiconductor element S operates by transmitting a signal between the semiconductor element S and the external electric circuit board via the wiring conductor 24 and the electronic component D.

Next, with reference to FIG. 5A to FIG. 6I, a method of manufacturing the conventional wiring board B will be described. Here, FIG. 5A to FIG. 6I illustrate schematic cross sectional views of principal portions of individual manufacturing steps.

First, as illustrated in FIG. 5A, the wiring conductor 24 adheres to the upper and lower surfaces of the first insulating layer 21a in which the through hole 23 penetrating from the upper surface to the lower surface is formed, and inside the through hole 23. The wiring conductor 24 is formed by, for example, a well-known semiadditive method or subtractive method.

Next, as illustrated in FIG. 5B, the cavity 22 is formed in the first insulating layer 21a. The cavity 22 is formed by, for example, blasting or laser processing.

Next, as illustrated in FIG. 5C, the first insulating layer 21a is placed on an adhesive sheet N.

Next, as illustrated in FIG. 5D, the electronic component D is inserted into the cavity 22, and the electronic component D is placed on the adhesive sheet N which is exposed in the cavity 22.

Next, as illustrated in FIG. 5E, the second insulating layer 21b is laminated on an upper side of the first insulating layer 21a. Generally, the second insulating layer 21b is laminated on the upper side of the first insulating layer 21a under a vacuum condition. With this arrangement, the second insulating layer 21b can be brought into intimate contact with the first insulating layer 21a firmly.

Next, as illustrated in FIG. 5F, the adhesive sheet N is peeled off.

Next, as illustrated in FIG. 6G, the first insulating layer 21a is laminated on the upper surface of the second insulating layer 21b. With this arrangement, the insulating board 21 is formed.

Then, as illustrated in FIG. 6H, the via hole 25, which exposes the electronic component D and the wiring conductor 24 on the first insulating layer 21a from the surfaces of the second insulating layers 21b, 21b, is formed. Thereafter, the wiring conductor 24 adheres to the surface of the second insulating layer 21b and inside the via hole 25.

Finally, as illustrated in FIG. 6I, the wiring board B is formed by adhering of the solder resist layer 26 including a first opening 26a and a second opening 26b which expose therein the wiring conductor 24 formed on the second insulating layers 21b, 21b.

However, when the wiring board B is formed according to such a method, the adhesive sheet N and the first insulating layer 21a are brought into intimate contact with each other firmly by an influence of a step for firmly bringing the second insulating layer 21b into intimate contact with the upper side of the first insulating layer 21a under the vacuum condition as described above. As a result, in the step of peeling off the adhesive sheet N from the first insulating layer 21a, an adhesive of the adhesive sheet N may remain on the surface of the first insulating layer 21a. In this way, if the adhesive remains on the surface of the first insulating layer 21a, adhesion between the first insulating layer 21a and the second insulating layer 21b is disturbed, separation between the two may be caused, and insulation properties between the wiring conductors 24 may become insufficient. As a result, this causes a problem of reduced insulation reliability of the wiring board B.

SUMMARY OF THE INVENTION

It is an object of the present invention to prevent separation between a first insulating layer and a second insulating layer, and provide a method of manufacturing a wiring board in which insulation properties between wiring conductors are excellent and which has high insulation reliability.

A method of manufacturing a wiring board according to the present invention includes the steps of: preparing an insulating layer including a cavity formation region and a wiring formation region surrounding the cavity formation region, and a separable metallic foil formed of a first metallic foil and a second metallic foil which are brought into intimate contact with each other in a separable manner; allowing the separable metallic foil to adhere to at least a lower face side of the insulating layer with the first metallic foil as an adhering surface; forming a cavity in the cavity formation region by digging the insulating layer and the separable metallic foil from an upper surface side of the insulating layer to a depth that reaches the second metallic foil on the lower surface side of the insulating layer but does not penetrate the second metallic foil; injecting a fixing resin into the cavity; inserting an electronic component into the cavity into which the fixing resin is injected, and fixing the electronic component by curing the fixing resin; and peeling off the second metallic foil from an intimate contact surface with the first metallic foil.

According to the method of manufacturing the wiring board according to the present invention, the cavity is formed by digging the insulating layer and the separable metallic foil to a depth that reaches the second metallic foil on the lower surface side of the insulating layer but does not penetrate the second metallic foil. Then, the electronic component is inserted into the cavity into which the fixing resin is injected, and the electronic component is fixed by curing the fixing resin. After the fixing resin is cured, the second metallic foil is peeled off from the intimate contact surface with the first metallic foil. In this way, the surface of the insulating layer is covered with the second metallic foil while the fixing resin is not cured. As a result, the fixing resin does not adhere to the surface of the insulating layer. With this arrangement, a different insulating layer can be brought into intimate contact with the surface of the insulating layer in a stable manner, and this makes it possible to provide a wiring board having high insulation reliability, in which insulation properties between wiring conductors formed in each of the insulating layers are excellent.

Other objects and advantages of the present invention will be apparent from the following description.

DESCRIPTION OF THE PREFERRED EMBODIMENTS

Figure 1:
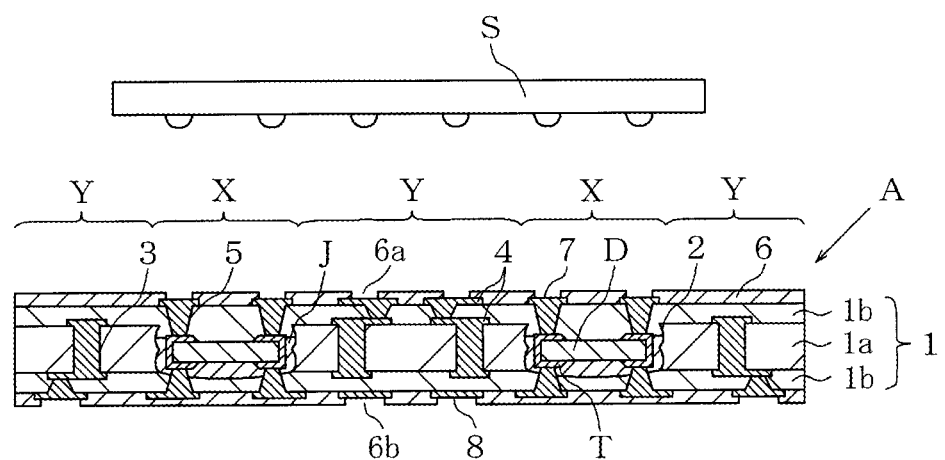
FIG. 1 is a schematic cross sectional view illustrating a wiring board manufactured by a method of manufacturing according to one embodiment of the present invention.

First, with reference to FIG. 1, a description will be given of a wiring board A manufactured by a method of manufacturing according to one embodiment of the present invention.

The wiring board A includes an insulating board 1, a wiring conductor 4, a solder resist layer 6 formed on the insulating board 1 and the wiring conductor 4, and an electronic component D accommodated in the insulating board 1.

The insulating board 1 includes a first insulating layer 1a, and second insulating layer 1b, 1b laminated on upper and lower surfaces of the first insulating layer 1a. In addition, the insulating board 1 includes a cavity formation region X and a wiring formation region Y that surrounds the cavity formation region X. A cavity 2 for accommodating therein the electronic component D is formed in the cavity formation region X. The electronic component D is accommodated in the cavity 2 while the electronic component D is fixed by a fixing resin J.

Further, a plurality of through-holes 3 are formed in the first insulating layer 1a. The wiring conductor 4 adheres to the upper and lower surfaces of the first insulating layer 1a and inside the through-hole 3. The wiring conductors 4, 4 on the upper and lower surfaces of the first insulating layer 1a are electrically connected to each other via the through holes 3.

A plurality of via holes 5 are formed in the second insulating layer 1b. The wiring conductor 4 also adheres to a surface of the second insulating layer 1b and inside the via holes 5. A part of the wiring conductor 4 on the surface of the second insulating layer 1b is electrically connected to the wiring conductors 4, 4 on the upper and lower surfaces of the first insulating layer 1a via the via holes 5. Further, a different part of the wiring conductor 4 on the surface of the second insulating layer 1b is electrically connected to an electrode T of the electronic component D through the via holes 5.

Further, a part of the wiring conductor 4 formed on the upper surface of the second insulating layer 1b on an upper surface side is exposed in a first opening 6a formed in the solder resist layer 6, and forms a semiconductor element connecting pad 7. By connecting an electrode of the semiconductor element S to the semiconductor element connecting pad 7 via a solder bump, the semiconductor element S is mounted on an upper surface of the wiring board A.

A part of the wiring conductor 4 formed on the lower surface of the second insulating layer 1b on a lower surface side is exposed in a second opening 6b formed in the solder resist layer 6, and forms an external connection pad 8 for connection to an external electric circuit board. Then, by connecting the external connection pad 8 and an electrode of the external electric circuit board to each other, the semiconductor element S is electrically connected to the external electric circuit board, and the semiconductor element S operates by transmitting a signal between the semiconductor element S and the external electric circuit board via the wiring conductor 4 and the electronic component D.

The electronic component D includes, for example, a chip capacitor for stabilizing power supply to a semiconductor element S, and the like.

Next, with reference to FIGS. 2A to 3K, a method of manufacturing the wiring board according to one embodiment of the present invention will be described. Here, FIGS. 2A to 3K illustrate schematic cross sectional views of principal portions of individual manufacturing steps. A portion identical with the portion of the wiring board A described with reference to FIG. 1 is identified with an identical reference numeral, and the detailed description thereof will be omitted.

Figure 2A:
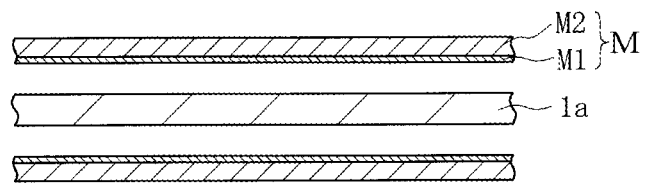
FIGS. 2A to 2F and FIGS. 3G to 3K are schematic cross sectional views of principal portions of individual steps for explaining the method of manufacturing according to one embodiment of the present invention.

First, as illustrated in FIG. 2A, the first insulating layer $1a$, and separable metallic foil M in which first metallic foil M1 and second metallic foil M2 are separably brought into intimate contact with each other are prepared. The first insulating layer $1a$ is made of an electric insulating material including, for example, glass cloth impregnated with a thermosetting resin such as epoxy resin or bismaleimide triazine resin.

Further, although copper foil is preferably used as the first metallic foil M1 and the second metallic foil M2 in view of economy and workability, it is not restricted to the copper foil. A thickness of the first metallic foil M1 is about 1 to 3 µm, and a thickness of the second metallic foil M2 is about 18 to 35 µm.

The separable metallic foil M can be obtained by firmly crimping the first metallic foil M1 and the second metallic foil M2 to each other, or bonding them together by an easily strippable adhesive.

Figure 2B:
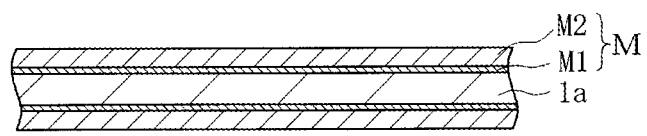

Next, as illustrated in FIG. 2B, the separable metallic foil M is placed on each of upper and lower surfaces of the first insulating layer $1a$ such that the first metallic foil M1 is placed on a side of the first insulating layer $1a$ (adhesion surface). Then, the separable metallic foil M adheres to each of the upper and lower surfaces of the first insulating layer $1a$ by heating and pressurizing the separable metallic foil M.

Figure 2C:
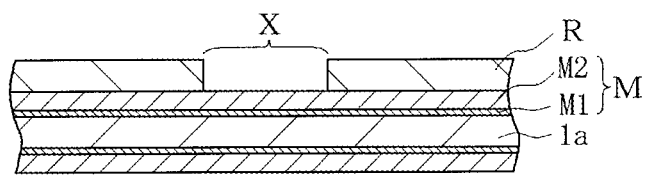

Next, as illustrated in FIG. 2C, a blast resist R is formed on a surface of the separable metallic foil M on an upper side. Here, the blast resist R is a resin film having resistance to blasting, and is formed by photolithographying a dry film containing urethane resin which has impact resilience, extends and has photosensitivity having heat resistance. The blast resist R includes an opening for exposing the separable metallic foil M in the cavity formation region X.

Figure 2D:
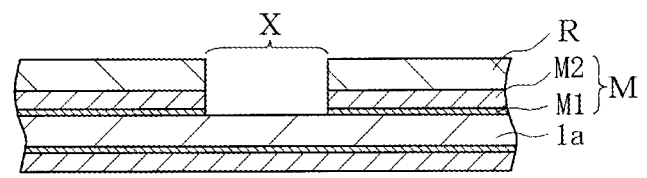

Next, as illustrated in FIG. 2D, a portion exposed in the opening of the blast resist R of the separable metallic foil M adhering onto the upper surface of the first insulating layer $1a$ is removed by etching.

Figure 2E:
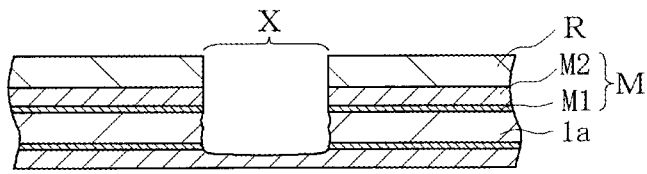

Next, as illustrated in FIG. 2E, the first insulating layer $1a$ which is exposed in the opening of the blast resist R is dug from above by blasting, and the cavity 2 for accommodating the electronic component D is formed. In doing so, the first insulating layer $1a$ and the separable metallic foil M are dug to a depth that reaches the second metallic foil M2 on a lower side of the first insulating layer $1a$, but does not penetrate second metallic foil M2. As described above, it is preferable that a thickness of the first metallic foil M1 be smaller than a thickness of the second metallic foil M2. With this arrangement, the processing becomes easier. In addition, the reason why the thickness of the first metallic foil M1 is made smaller than the thickness of the second metallic foil M2 is that it is necessary to make the thickness smaller for forming the wiring conductor 4 using at least a part of the first metallic foil M1 as will be described later, whereas it is possible that, unless the second metallic foil M2 is made larger to a certain degree, the second metallic foil M2 may be broken when it is peeled off and may not be peeled off well as will be described later. A depth of a depression formed in the second metallic foil M2 is preferably about 10 µm. If the depth of the depression is larger than 10 µm, a contact area between the fixing resin J and the second metallic foil M2 becomes larger. For this reason, there is a case where the second metallic foil M2 is difficult to be peeled off in a step described later in which the second metallic foil M2 is peeled from the first metallic foil M1.

The blasting can be performed using particles such as alumina having a particle size of 10 to 30 µm as a projection material.

Figure 2F:
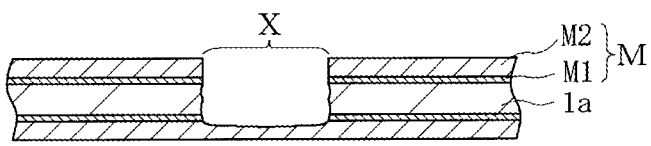

Next, as illustrated in FIG. 2F, the blast resist R is peeled off and removed from the separable metallic foil M.

Figure 3G:
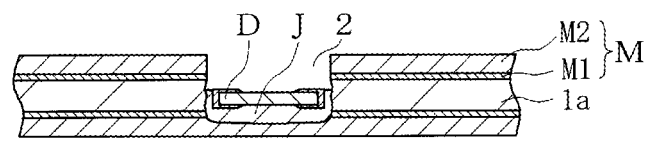

Next, as illustrated in FIG. 3G, after the fixing resin J is injected into the cavity 2, the electronic component D is inserted into the cavity 2. Then, the electronic component D is fixed inside the cavity 2 by curing the fixing resin J. In doing so, the second metallic foil M2 serves to cover and protect the first insulating layer $1a$ so that the fixing resin J which has not been cured does not adhere thereto.

Figure 3H:
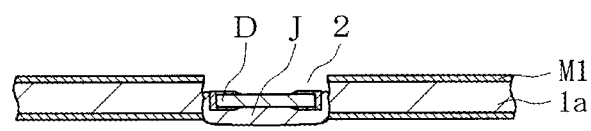

Next, as illustrated in FIG. 3H, the second metallic foil M2 is peeled off and removed from an intimate contact interface between the second metallic foil M2 and the first metallic foil M1.

Figure 3I:
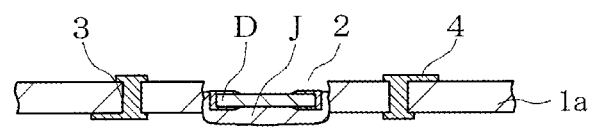

Next, as illustrated in FIG. 3I, the through-hole 3 is formed in the first insulating layer $1a$. Then, the wiring conductor 4 is formed on the surface of the first insulating layer $1a$ and inside the through-hole 3. The through-hole 3 has a diameter of about 50 to 300 µm, and is formed, for example, by drilling, laser processing, blasting, or the like. The wiring conductor 4 can be formed by a well-known semiadditive method. During such a process, electroless plating is applied in the through-hole 3, and the wiring conductor 4 may be formed by the electroless plating, and by adhering of electrolytic plating while the first metallic foil M1 on the surface of the first insulating layer $1a$ serves as a base metal.

Figure 3J:
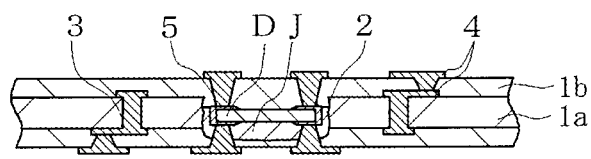

Next, as illustrated in FIG. 3J, the second insulating layer $1b$ is laminated on upper surfaces of the first insulating layer $1a$ and the wiring conductor 4 by a well-known build-up process, and the via hole 5 is formed. Thereafter, the wiring conductor 4 is formed in the second insulating layer $1b$ and the via hole 5. A diameter of the via hole 5 is about 20 to 100 µm. The via hole 5 is formed, for example, by laser processing. The second insulating layer $1b$ is made of an electric insulating material including, for example, glass cloth impregnated with a thermosetting resin such as epoxy resin or bismaleimide triazine resin.

Figure 3K:
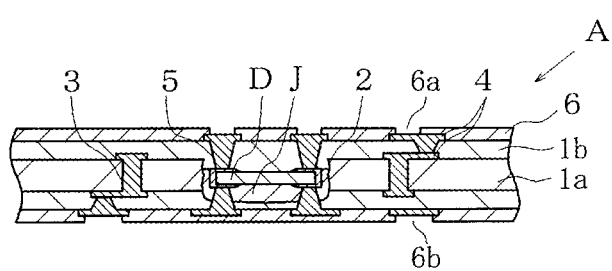
Figure 4:
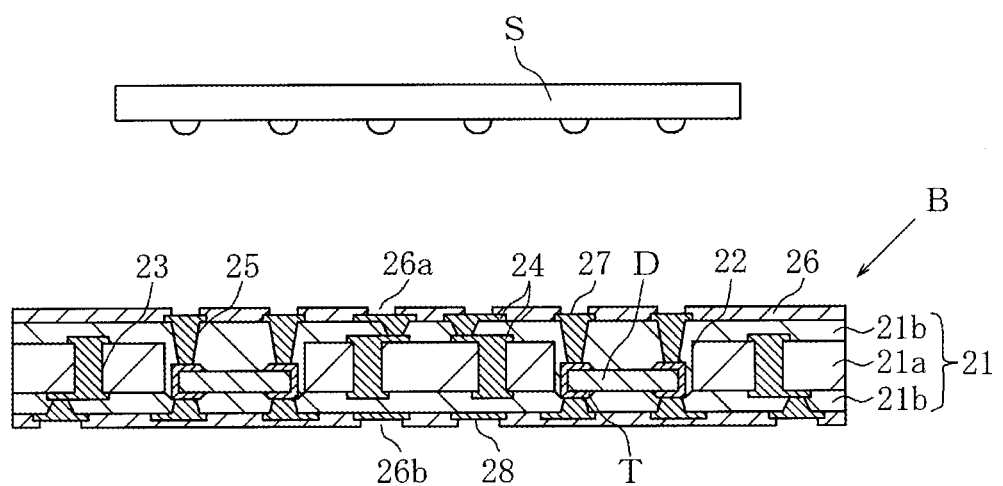
FIG. 4 is a schematic cross sectional view illustrating a wiring board manufactured by a conventional method of manufacturing.
Figure 5A:
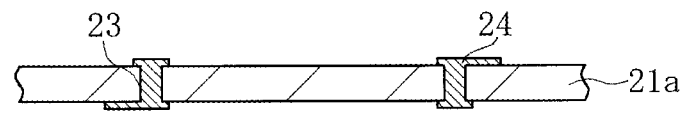
FIGS. 5A to 5F and FIGS. 6G to 6I are schematic cross sectional views of principal portions of individual steps for explaining a conventional method of manufacturing.
Figure 5B:
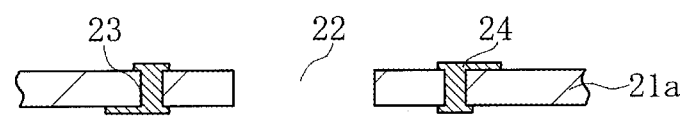
Figure 5C:
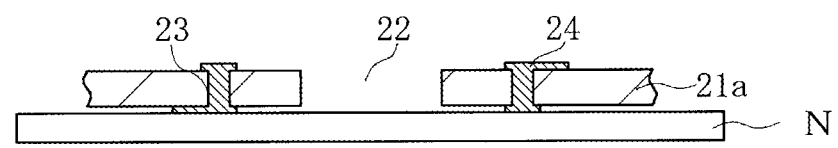
Figure 5D:
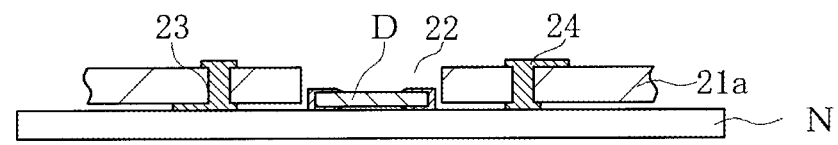
Figure 5E:
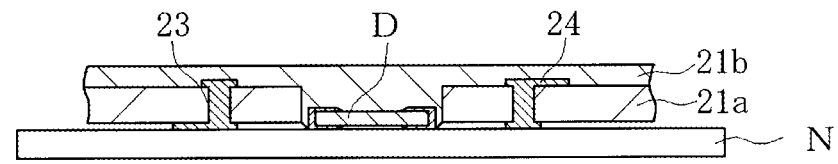
Figure 5F:
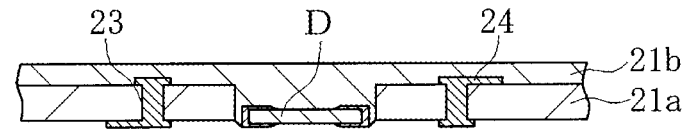
Figure 6G:
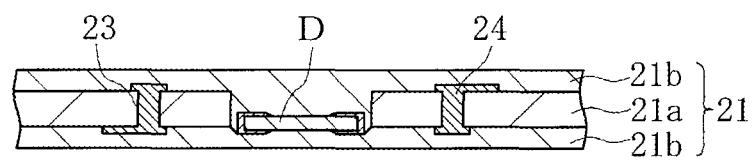
Figure 6H:
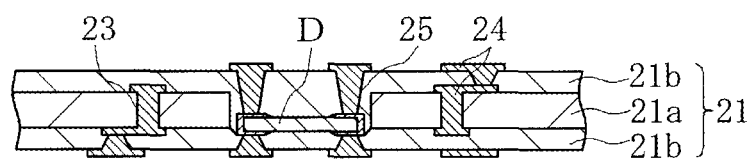
Figure 6I:
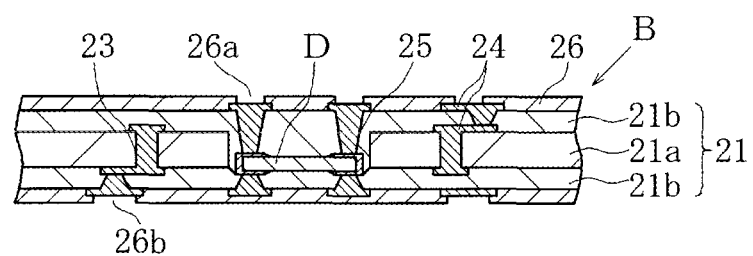

Finally, as illustrated in FIG. 3K, the wiring board A is formed by forming the solder resist layer 6 including the first opening $6a$ on the surface of the second insulating layer $1b$ on the upper side, and forming the solder resist layer 6 including the second opening $6b$ on the surface of the second insulating layer $1b$ on the lower side.

The solder resist layer 6 is formed by coating or sticking, for example, a resin paste or a film on the second insulating layer $1b$ and the wiring conductor 4, and thermally curing it. The resin paste or the film is made of an electric insulating material including thermosetting resin such as epoxy resin or polyimide resin.

According to the method of manufacturing the wiring board according to one embodiment of the present invention, the cavity 2 is formed by digging the first insulating layer $1a$ and the separable metallic foil M to a depth that reaches the second metallic foil M2 on a lower surface side of the first insulating layer $1a$ but does not penetrate the second metallic foil M2. Then, the electronic component D is fixed by injecting the fixing resin J into the cavity 2, inserting the electronic component D into the cavity 2 into which the fixing resin J has been injected, and curing the fixing resin J. Then, after the fixing resin J is cured, the second metallic foil M2 is peeled off from an intimate contact surface with the first metallic foil M1. In this way, the surface of the first insulating layer 1a is covered with the first metallic foil M1 while the fixing resin J is not cured. Consequently, the fixing resin J does not adhere to the surface of the first insulating layer 1a. With this arrangement, the second insulating layer 1b can be brought into intimate contact with the surface of the first insulating layer 1a in a stable manner, and this makes it possible to provide a wiring board having high insulation reliability, in which insulation properties between wiring conductors 4 formed in the first and second insulating layers are excellent.

The present invention is not restricted to the embodiment described above, but can by variously modified within the scope recited in the claims. For example, although the cavity 2 is formed by blasting in the embodiment described above, this may be formed by laser processing, rooter processing, or drilling.

What is claimed is:

1. A method of manufacturing a wiring board, comprising the steps of:

preparing an insulating layer including a cavity formation region and a wiring formation region surrounding the cavity formation region, and a separable metallic foil formed of a first metallic foil and a second metallic foil which are brought into intimate contact with each other in a separable manner;

allowing the separable metallic foil to adhere to an upper side and a lower side of the insulating layer with the first metallic foil serving as an adhering surface;

forming a blast resist including an opening for exposing the separable metallic foil in the cavity formation region on a surface of the separable metallic foil adhering to the upper side of the insulating layer;

removing by etching the separable metallic foil on the upper side of the insulating layer exposed in the opening of the blast resist;

digging the insulating layer exposed in the opening of the blast resist from above by blasting, and forming a cavity having a depth that reaches the second metallic foil on the lower side of the insulating layer but does not penetrate the second metallic foil;

removing the blast resist from the separable metallic foil on the upper side;

injecting a fixing resin into the cavity;

inserting an electronic component into the cavity into which the fixing resin is injected, and fixing the electronic component by curing the fixing resin;

peeling off the second metallic foil from an intimate contact surface with the first metallic foil; and forming a wiring conductor using a part of the first metallic foil in the wiring formation region.

2. The method of manufacturing a wiring board according to claim 1, wherein a thickness of the first metallic foil is smaller than a thickness of the second metallic foil.

3. The method of manufacturing a wiring board according to claim 1, wherein, after the second metallic foil is peeled off from the intimate contact surface with the first metallic foil, a through-hole is formed in the insulating layer, and the wiring conductor is formed on a surface and in the through-hole of the insulating layer.

4. The method of manufacturing a wiring board according to claim 3, wherein a second insulating layer is laminated on upper surfaces of the insulating layer and the wiring conductor, a via hole is formed in the second insulating layer, and the wiring conductor is formed in the second insulating layer and the via hole.

5. The method of manufacturing a wiring board according to claim 4, wherein a solder resist layer including an opening in which a part of the wiring conductor is exposed is formed on a surface of the second insulating layer.

* * * * *